United States Patent [19]

Valley

[11] Patent Number: 4,590,391
[45] Date of Patent: May 20, 1986

[54] MULTI-INPUT ZERO OFFSET COMPARATOR

[75] Inventor: Richard L. Valley, Nashua, N.H.

[73] Assignee: Unitrode Corporation, Lexington, Mass.

[21] Appl. No.: 562,720

[22] Filed: Dec. 19, 1983

[51] Int. Cl.[4] ............... H03K 5/24; G01R 19/165
[52] U.S. Cl. .................................... 307/355; 307/357; 307/360; 307/364
[58] Field of Search ............... 307/355, 354, 357, 360, 307/362, 364

[56] References Cited

U.S. PATENT DOCUMENTS 3,735,151  5/1973  Frederiksen et al. ............ 307/362
4,177,394  12/1979  Takasugi ........................ 307/357
4,300,063  11/1981  Dunphy et al. .................. 307/360

Primary Examiner—John Zazworsky
Attorney, Agent, or Firm—Weingarten, Schurgin, Gagnebin & Hayes

[57] ABSTRACT

A multiple input window comparator for use in apparatus requiring sensing of a voltage window, such as power supplies and system monitors, including a first comparator having multiple input transistors, each of which receives a signal to be compared. The comparator characteristics for each input signal are balanced through the use of a current mirror circuit connected to each input transistor. A complementary second comparator circuit is provided which, in combination with the first comparator circuit, produces a signal indicating when one or more of the input signals exceeds the voltage boundaries (voltage window) defined by reference signals of the first and second comparator. The circuit topology of each of the first and second comparators produces a zero input voltage offset with respect to the respective reference voltage, such that the comparator output signal occurs substantially instantaneously and uniformly with the transition of the threshold voltage by one or more of the input signals. The comparator may be implemented with separate, discrete components or entirely on a single integrated circuit.

7 Claims, 1 Drawing Figure

MULTI-INPUT ZERO OFFSET COMPARATOR

FIELD OF THE INVENTION

The present invention relates to electronic comparator circuits, and in particular to zero voltage offset comparators having multiple inputs.

BACKGROUND OF THE INVENTION

Power supplies and associated systems typically have voltages critical to proper equipment operation, each of which voltages must be monitored and maintained in accordance with an acceptable voltage range of voltage window. One particular technique for voltage monitoring involves the use of separate comparators, each receiving a separate input and a reference derived from a common threshold voltage or set of respective voltage thresholds. However, the use of multiple comparators requires additional summing logic or combination elements, as well as matching of the components of each comparator if identical performance relative to the input signals is desired. The resulting comparator circuit to accommodate multiple-input voltages is large, complex, and expensive.

Another known circuit comprises a single integrated circuit comparator which incorporates a differential input stage, with additional input transistors connected in parallel (to the collector and emitter of the signal input transistor). Each parallel input transistor base receives a respective input voltage to be compared. The other (differential) transistor in the differential pair receives a reference voltage to establish a threshold. However, this approach provides true sensing of only one input voltage at a time. Should more than one input signal approach the threshold voltage, the respective parallel-connected input transistors each begin to partially conduct. As a result, the total current for all of the partially conducting transistors will equal the current for a single input transistor having a respective input signal exactly at the threshold voltage. Therefore, the result is to effectively lower the reference voltage threshold when a plurality of input signals simultaneously approach the threshold voltage, providing erroneous indication of the status of the input signals.

In particular, where K represents the number of parallel-input transistors having respective sense inputs, the point at which the differential amplifier output signal changes to indicate that a signal has crossed the reference threshold, will be lowered by a voltage equal to 26 mV $\times$ ln(K) at room temperature, or 35 mV $\times$ ln(K) at 125° C., where ln denotes a natural logarithm. For four inputs (K=4) at room temperature, this is equivalent to a 36 mV threshold change, representing a significant error in the voltage sensing operation of the comparator.

BRIEF DESCRIPTION OF THE INVENTION

The comparator of the present invention includes a multiple input comparator amplifier, wherein each input signal is applied to a corresponding transistor. Each transistor receives current from a separate current mirror element. The current mirror elements are interconnected to a common current control to insure a uniform threshold and independent switching operation relative to each input of the comparator. The change in the comparator output signal occurs uniformly according to the comparison of each input signal and the common threshold voltage, regardless of the number of inputs simultaneously approaching the threshold voltage. The comparator amplifier has a differential amplifier topology, formed by the input transistors in combination with a differential transistor. The current mirror current control receives a portion of the differential transistor output signal, to insure that the transition of the reference voltage by each sense input signal occurs at a definite transition point, and at a zero voltage difference between any input signal and the threshold voltage. An output signal from each input transistor is combined with a multiple-input digital gate to provide a comparator output signal. The signal of one comparator is combined with a second, complementary comparator also receiving the input signals and having a different threshold voltage, to indicate the transition out of a predetermined voltage window defined by the threshold voltages, of one or more sense input signals.

DESCRIPTION OF THE DRAWING

These and other features of the present invention will be better understood from the following detailed description, taken together with the drawing, the single figure of which shows a schematic diagram of a preferred embodiment of the present invention, having two comparator circuits combined to provide a fault condition when an input signal exceeds a predetermined voltage window.

DETAILED DESCRIPTION OF THE INVENTION

Figure 1:
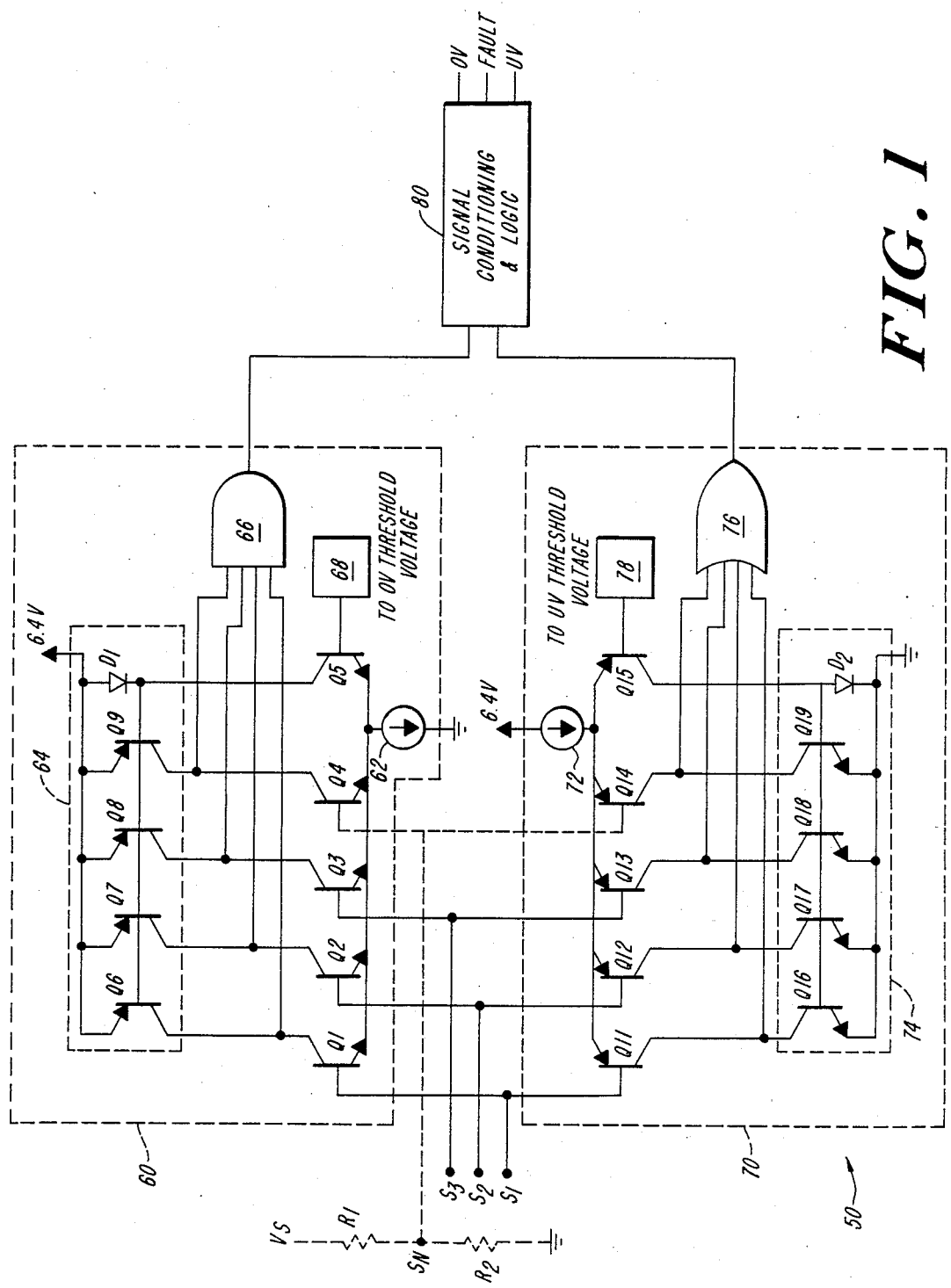

A schematic diagram 50 of the comparator according to the present invention is shown in the drawing, wherein a plurality of input signals are compared to a predetermined voltage range, which defines a voltage window. The comparator provides a corresponding fault signal when one or more input (sense) signals exceeds the voltage window. In addition, an overvoltage or undervoltage signal is also produced to indicate the direction in which the sense signal exceeds the defined window. The particular embodiment shown includes four sensing inputs, but may be expanded to include as many inputs as necessary, or reduced to two sensing inputs. Of particular importance is that the active elements of the comparators 60 and 70, while being represented by bipolar transistors, may also include other known active devices such as Field Effect Transistors (FETs).

Each signal sensed $S_1$, $S_2$, $S_3$, ... $S_N$ may be scaled to the desired voltage window by the use of a voltage divider network, including resistors $R_1$ and $R_2$. The comparator includes a first comparator circuit 60 and a second comparator circuit 70, each having outputs combined by a signal conditioning and logic element 80, to produce a fault signal and corresponding overvoltage and undervoltage output signals. The first comparator circuit 60 is used to detect an overvoltage condition of one or more of the sense input signals. The first circuit includes a plurality of input transistors $Q_1$, $Q_2$, $Q_3$, and $Q_4$, together with a differential (threshold voltage) transistor $Q_5$ to form a differential amplifier. The signals $S_1$, $S_2$, $S_3$, ... $S_N$ are applied to the base, or control regions, of transistors $Q_1$, $Q_2$, $Q_3$, and $Q_4$. The differential transistor $Q_5$ receives a reference voltage from source 68, which establishes the comparator voltage threshold value. The comparator circuit 60 also includes a current source 62 connected to the emitter, or source regions, of each of the differential amplifier transistors $Q_1$–$Q_5$. The input transistors $Q_1$–$Q_4$ collectors, or transistor drain regions, are each supplied with pull-up current from a load element comprising a current mirror 64 which includes transistors $Q_6$, $Q_7$, $Q_8$, and $Q_9$. Each current mirror transistor $Q_6$–$Q_9$ provides a current equal to the current passing through diode $D_1$, which is determined by the current drawn by the differential (threshold) transistor $Q_5$ of the differential amplifier.

As the sense input voltage rises relative to the reference voltage threshold, the respective input transistor does not conduct until the input voltage received by the input transistor approaches the reference voltage, at which time the input transistor begins to steer the current away from the threshold transistor $Q_5$, as a result of having a current flow limited by the current source 62. However, as the threshold transistor $Q_5$ provides progressively less current to the current mirror 64 diode $D_1$, the current mirror in turn provides less current from each of the current mirror pull-up sources $Q_6$–$Q_9$, allowing the voltage at the collector of the respective input transistor to fall more rapidly. Thus, as a particular input transistor becomes increasingly conductive, the change in collector signal occurs when the collector current through that particular device is equal to the current through device $Q_5$, providing a collector voltage transition with a zero input offset characteristic. The use of a multiple section current mirror 64, together with a differential amplifier current source 62, insures that all input signals are equally measured, and that the input transistors each produce an equal and independent output response for the corresponding input transition of the respective threshold voltage. When all of the sense input signals are less than the threshold voltage 68, the collectors of each of the sense transistors $Q_1$–$Q_4$ are in a logical high state. The signals at the collectors of transistors $Q_1$–$Q_4$ are combined by an AND gate 66 to produce a logical high output signal when no sense input exceeds the threshold voltage 68, and a logical low signal when one or more of the sense inputs exceeds the threshold voltage 68.

A complementary second comparator circuit 70 provides the indication of an undervoltage condition of the same sensed input signals as sensed by overvoltage comparator circuit 60, discussed above. The complementary comparator circuit 70 includes a differential amplifier having four sense signal input transistors $Q_{11}$, $Q_{12}$, $Q_{13}$, and $Q_{14}$, in combination with a differential (threshold) transistor $Q_{15}$, to form the differential amplifier in combination with a current source 72. The input transistors $Q_{11}$–$Q_{14}$ receive the same input signals $S_1$, $S_2$, $S_3$, ...$S_N$ as transistors $Q_1$–$Q_4$ of circuit 60, above. The threshold transistor $Q_{15}$ receives a threshold voltage from a source 78. Each of the transistors $Q_{11}$–$Q_{15}$ are of a complementary polarity from the input transistors $Q_1$–$Q_5$ of the circuit 60, discussed above. Similarly, the transistors $Q_{11}$–$Q_{15}$ have pull-down currents provided by portions of a current mirror 74 acting as collector load elements. The current mirror 74 includes transistors $Q_{16}$, $Q_{17}$, $Q_{18}$, and $Q_{19}$, which provide the pull-down current to transistors $Q_{11}$–$Q_{14}$, according to the current drawn through the diode $D_2$, which is determined by the current drawn by transistor $Q_{15}$. As discussed above, the differential circuit is limited to a current determined by a current source 72; the current source 72 limits the current. When all of the sensed input signals are greater than the voltage threshold defined by reference voltage 78, all of the input transistors $Q_{11}$–$Q_{14}$ are in an off state, allowing the input transistors $Q_{11}$–$Q_{14}$, in combination with pull-down transistors $Q_{16}$–$Q_{19}$ to provide signals all in a logical low state. When one or more of the sensed inputs exceeds the reference voltage 78 threshold, that is is less the threshold voltage 78, the respective transistors $Q_{11}$–$Q_{14}$ becomes conductive, drawing current from the differential (threshold) transistor $Q_{15}$, thereby causing the current mirror to drop the current provided by the respective pull-down transistor, enhancing the speed or rate of change of the respective input transistor collector signal voltage. The signals from the collectors of transistors $Q_{11}$–$Q_{14}$ are logically combined by an OR logical gate 76, which produces a logical low signal when all sensed input signals are greater than the lower threshold voltage 78, and to produce a logical high signal when one or more sensed signals are less than the threshold voltage 78, corresponding to a fault condition.

The logical signals from the AND gate 66 and OR gate 76 of circuits 60 and 70 are combined by a signal conditioning and logic circuit 80. The logical elements 66 and 76, which produce the high and low logical signals as discussed above, are combined in the signal conditioning and logic circuit 80 to produce a fault signal when one or more of the sensed input signals is greater than the threshold voltage 68 or less than the threshold voltage 78, and to further provide the corresponding overvoltage or undervoltage signal to more specifically indicate the overvoltage and/or undervoltage nature of the fault condition. The implementation of the signal conditioning and logic circuit can be provided by one skilled in the art, and is not discussed here. Moreover, additional processing and logic circuits can be included as desired, as well as integration of the present invention with other circuit portions.

Apparatus produced by modification and substitution of components connected according to the above invention by one skilled in the art is considered to be within the scope of the present invention. Therefore, the present invention is not to be limited except by the claims which follow.

What is claimed is:

1. A comparator to sense the voltage level of a plurality of input signals relative to a first reference signal, having a first circuit comprising:
   a current mirror circuit providing a plurality of equal current signals in response to control signal;
   a current source controlling a current flow;
   a plurality of sensing transistors each having a base, an emitter, and a collector, wherein
   the base of each said sensing transistor receiving an input signal to be sensed;
   the emitter of all said sensing transistors being connected to said current source; and
   the collector of each said sensing transistors receiving an equal current signal from said current mirror circuit and producing an output signal;
   a differential transistor having a base, an emitter, and a collector, wherein
   the collector of said differential transistor is connected to provide said current mirror control signal;
   the base of said differential transistor is connected to said first reference signal; and
   the emitter of said differential transistor is connected to the emitters of said plurality of said sensing transistors and to said current source; and means to combine the output signal of said plurality of sensing transistors to produce a comparator first circuit output signal according to the relationship of each said input signal to said first reference signal, wherein said current flow controlled by said current source is directed from said differential transistor to at least one said input transistor when the respective input signal exceeds said first reference signal to produce a corresponding output signal on the respective collector output.

2. The comparator of claim 1, further including a second circuit complementary to said first circuit having a second reference signal, also receiving said plurality of input signals to produce an output signal when at least one said input signal exceeds said second reference signal, producing a second circuit output signal; and logic means receiving said first and second circuit output signal to produce a fault signal when at least one of said input signals lies outside of a voltge range defined by said first and second reference signals.

3. The comparator of claim 2, including means to indicate an overvoltage condition when at least one of said input signals is higher than the first reference signal.

4. The comparator of claim 2, including means to indicate an undervoltage condition when at least one of said input signals is below the second reference signal.

5. A multiple input comparator, comprising a plurality of input transistors and a differential transistor, each having a control region, a source of minority carriers, and a minority carrier drain, wherein each input transistor receives an input signal and the differential transistor receives a reference signal at the respective transistor control regions;

a constant current source providing a flow of carriers to said source of each said transistor;

a current mirror having a plurality of elements, each connected to the respective drain of said input transistors, each element to receive current therefrom according to current drawn by said differential transistor, wherein each said input transistor conducts when the respective input voltage approaches said reference signal whereupon the respective input transistor begins to steer current away from the differential transistor resulting in a reduced current received by the respective element of said current mirror; and wherein the current mirror elements current being reduced according to the reduced current drawn by said differential transistor, allowing the voltage at the respective drain region to fall more rapidly to produce a rapid signal transition at the respective drain region for a respective input signal equal to said threshold signal, each said signal transition being independent from the signal transition of other drain regions; and logic means connected to each drain region of each input transistor, to provide an output signal when at least one input signal exceeds the amplitude of said reference signal.

6. The comparator of claim 5, wherein said plurality transistors comprise bipolar transistors; said control is a base region;

said source is an emitter region; and said drain is a collector region.

7. A multiple input comparator for sensing the excursion of at least one input signal beyond a voltage window defined by a first reference voltage and second reference voltage, comprising:

a first comparator having a plurality of signal inputs providing independent threshold comparison of the signals provided to each of said signal inputs with said first reference, and producing an overvoltage signal when at least one of said signal inputs receives a signal greater than said first reference;

a second comparator having a plurality of inputs common to said first comparator, providing independent threshold comparison of the signals provided to each of said inputs to said second reference, and producing an undervoltage signal when at least one of said signal inputs receives a signal less then said second reference; and logic means receiving said overvoltage and undervoltage signal and producing a fault signal therefrom to indicate the signal received by at least one of said inputs is outside of said window voltage range, wherein at least one of said first and second comparators includes a differential amplifier having input active elements corresponding to each said input, each active input element receiving a current flow from a common current source, and each active element connected to a separate load element, wherein the separate load elements comprise part of a current mirror circuit, and wherein a comparator output is produced by a logical combination of signals formed across each said load element.

* * * * *